United States Patent
Peterson (10) Patent No.: US 9,866,051 B2
(45) Date of Patent: Jan. 9, 2018

(54) ADAPTIVE CHARGER TO MAXIMIZE CHARGE RATE

(71) Applicant: Electrochem Solutions, Inc., Clarence, NY (US)

(72) Inventor: Brian R. Peterson, Cumberland, RI (US)

(73) Assignee: Electrochem Solutions, Inc., Clarence, NY (US)

( * ) Notice: Subject to any disclaimer, the term of this patent is extended or adjusted under 35 U.S.C. 154(b) by 256 days.

(21) Appl. No.: 14/492,112

(22) Filed: Sep. 22, 2014

(65) Prior Publication Data

US 2015/0084582 A1   Mar. 26, 2015

Related U.S. Application Data

(60) Provisional application No. 61/880,645, filed on Sep. 20, 2013.

(51) Int. Cl.
| | |
|---|---|
| H02J 7/00 | (2006.01) |
| G01R 19/00 | (2006.01) |
| H02J 7/02 | (2016.01) |
| H02J 7/04 | (2006.01) |

(52) U.S. Cl.
CPC .......... *H02J 7/007* (2013.01); *G01R 19/0092* (2013.01); *H02J 7/0052* (2013.01); *H02J 7/0055* (2013.01); *H02J 7/025* (2013.01); *H02J 7/045* (2013.01)

(58) Field of Classification Search
USPC ......................................................... 320/107
See application file for complete search history.

(56) References Cited

U.S. PATENT DOCUMENTS

| | | |
|---|---|---|
| 5,325,040 A | 6/1994 | Bogut et al. |
| 5,986,437 A | 11/1999 | Lee |
| 6,222,347 B1 | 4/2001 | Gong |
| 6,917,124 B2 | 7/2005 | Shetler et al. |
| 7,737,665 B2 | 6/2010 | Grewe et al. |
| 7,755,331 B2 | 7/2010 | Kawahara et al. |
| 7,872,450 B1 | 1/2011 | Cohen et al. |
| 8,138,723 B2 | 3/2012 | Carkner |

(Continued)

FOREIGN PATENT DOCUMENTS

WO        2008145434       12/2008

OTHER PUBLICATIONS

Simpson, "Battery Charging", Texas Instruments; Literature Number: SNVA557; LM2576, LM3420, LP2951, LP2952; National Semiconductor, 2011.

(Continued)

*Primary Examiner* — Robert Grant
(74) *Attorney, Agent, or Firm* — Steven W. Winn; Michael F. Scalise (57) ABSTRACT

An electrical system for charging an electrochemical cell or battery pack is described. The system is configured to dynamically modify the magnitude of the charge power based on the amplitude of the available power source. The system comprises a master control unit which measures the strength of the available incoming power source and dynamically modifies the charge current used to charge an electrochemical cell or battery pack based on the strength of the incoming electrical power available to the system.

36 Claims, 6 Drawing Sheets

(56) References Cited

U.S. PATENT DOCUMENTS

| | | |
|---|---|---|
| 8,183,826 B2 | 5/2012 | Tuffner et al. |
| 2008/0238361 A1* | 10/2008 | Pinnell .................... H02J 7/045 320/107 |
| 2010/0026240 A1 | 2/2010 | Jiang et al. |
| 2011/0089886 A1 | 4/2011 | Dubovsky |
| 2012/0194141 A1* | 8/2012 | Shi ........................ H02J 7/0073 320/137 |
| 2013/0162200 A1 | 6/2013 | Terry et al. |
| 2013/0234658 A1* | 9/2013 | Endo ........................ H02J 7/025 320/108 |

OTHER PUBLICATIONS

EPSEARCH, "14185813", Mar. 17, 2015.

\* cited by examiner

ADAPTIVE CHARGER TO MAXIMIZE CHARGE RATE

CROSS-REFERENCE TO RELATED APPLICATION

This application claims priority from U.S. Provisional Patent Application Ser. No. 61/880,645 filed Sep. 20, 2013.

FIELD OF THE INVENTION

The present invention relates to a circuit for charging an electrochemical cell. In particular, the invention relates to a circuit for dynamically charging an electrochemical cell as a function of the available electrical power.

PRIOR ART

Battery chargers are typically used to recharge an electrochemical cell or battery pack. The electrical circuitry within these chargers is designed to convert an electrical power source into an electrical energy that is used to recharge the electrochemical cell or battery pack. As such, battery chargers comprise electrical circuitry that controls the amount of electrical energy that is replenished within the cell. Traditional battery charger circuits are generally configured with preset thresholds that limit the amount of voltage and/or current applied to a cell. These prior battery charger circuits are generally designed with preset incoming power minimum and maximum thresholds having voltage or current limits. The prior art circuitry is generally configured with electrical components which rigidly fix these threshold power levels. Thus, if the amount of electrical power coming into the charger is not at least to the predefined minimum power threshold, the charger will not operate and thus, the connected battery is not charged. Likewise, if the magnitude of the incoming power exceeds a predefined maximum input power threshold, the connected battery will only be charged at the predefined maximum power threshold. Therefore, a battery or battery pack may be inefficiently charged as any excess incoming electrical power is not utilized to charge the battery. Furthermore, a battery or battery pack may be inefficiently charged or not even charged at all if the available power decreases below the predefined charging voltage and current thresholds.

Wireless power is one such example in which the magnitude of electrical power typically fluctuates with time. In general, the strength of the electrical power from a wireless power source is dependent upon the separation distance and angular position of respective transmission and, receiving wireless power coils. Thus, as the separation distance between the transmitting and receiving coils increases and/or the angular position between the respective coils becomes increasingly askew, the amount of the transmitted electrical power decreases. Likewise, as the separation distance between the respective transmitting and receiving coils decreases and/or the position of the respective coils becomes more aligned, the magnitude of the transmitted electrical power increases. Therefore, it is fairly common for the strength of a wirelessly transmitted electrical power source to fluctuate, particularly when the receiving coil is moved. For example, when a wirelessly power tool comprising a receiving coil is manipulated, the power received by the device may increase or decrease as the device is moved relative to the transmitting coil. Furthermore, the power available from a traditional electrical outlet may fluctuate due to an intentional or unintentional drop in voltage.

Therefore, what is needed is a battery charger that is designed to dynamically adapt to a changing magnitude of electrical power such that an electrochemical cell or battery pack is efficiently charged. In addition, what is needed is a battery charger that is capable of capturing and utilizing wirelessly transmitted power.

The present invention thus provides a battery charger that is capable of adapting to an available electrical power source having a fluctuating magnitude of power. Specifically, the charger of the present invention is configured to dynamically modify the strength of the charge power by adapting to a wide range of available power levels such that the power is optimized to charge an electrochemical cell or battery pack. Unlike battery chargers of the prior art that have rigidly fixed power thresholds, the charger of the present invention is configured with a micro control unit that dynamically changes the charging power as a function of the amount of available electrical power coming into the system. Thus, the battery charger of the present invention is configured to optimally and safely charge a battery based on the magnitude of electrical power available to the system. For example, if the amount of available electrical power decreases to a relatively low level, the charger is capable of detecting and measuring the power decrease and configuring itself such that a battery can be charged at a lower power level that would otherwise not be permitted by the prior art. Likewise, as the available power increases, the charger is configured to dynamically increase the charging current in step with the increasing amount of electrical power such that the available electrical, power is optimally used to efficiently and safely charge a connected battery or battery pack.

SUMMARY OF THE INVENTION

The battery charger system of the present invention is configured to dynamically modify the amplitude of the electrical power used to charge an electrochemical cell or battery pack based on the strength of the incoming electrical power source. The dynamic adjustment of the amplitude of the charging power is enabled through control of the charger by a master control circuit based on constant feedback of the parameters of the incoming electrical power.

The charging system comprises a micro control unit (MCU) and a digital to analog converter (DAC) that work in tandem to control the electrical power settings utilized to charge an electrochemical cell. Unlike traditional battery chargers, which utilize a circuit having electronic components that establish rigidly fixed input power thresholds, the micro-controller within the system communicates with the charge circuit and enables dynamic charge power adjustments based on the changing parameters of the incoming electrical power. The master control circuit monitors the changing conditions of the incoming electrical power, analyzes the incoming electrical power parameters and instructs the operation of the charge circuit based on the monitored parameters of the incoming power. In other words, based on analysis of the incoming electrical power, the master control circuit provides the charge circuit with the parameters, i.e., electrical current and voltage, with which to charge a cell or battery pack. Thus, a cell or battery pack can be optimally and safely charged based on the in situ conditions of the electrical power available to the system.

Specifically, the battery charge system is configured with a micro control unit (MCU) that receives an analog input of the available electrical power. This analog input, which can either be in the form of an electrical current and/or electrical voltage, is first received by an analog to digital converter (ADC). Once received by the ADC, the analog input is then converted to a digital signal which is received and analyzed by the (MCU). The (MCU) thus determines the magnitude of the available electrical power and calculates an appropriate charge current and/or charge voltage that is utilized to optimally and safely charge a battery. After the (MCU) determines the amount of electrical charge power that is appropriate given the available incoming electrical power and safe charging conditions, the (MCU) emits a digital signal to the charger circuit which establishes the charge current and voltage parameters.

The battery charging system of the present invention is preferably designed to utilize wirelessly transmitted electrical energy such as near field resonant inductive coupling. In near field resonant inductive coupling, electrical energy is transferred wirelessly between two resonators that are tuned to resonate at about the same frequency. The first or source resonator is electrically connected to a power supply and the second or receiving resonator is positioned a distance from the source resonator. When the two resonators resonate, an oscillating magnetic field between the two is created that enables transfer of electrical energy therebetween. More specifically, near field resonant inductive coupling typically uses coupled electromagnetic resonators with long-lived oscillatory resonant modes to transfer electrical power. Near field resonant inductive coupling is further discussed in U.S. Pat. No. 8,461,719 to Kesler et al.

However, in near field inductive coupling, the strength of the wirelessly transmitted electrical power is primarily dependent upon the distance and angular position of the respective transmitting and receiving coils. For example, as the distance between the transmitting and receiving coils increases the strength of the wirelessly transmitted electrical power generally decreases. Likewise, when the distance between the transmitting and receiving coils decreases, the strength of the wirelessly transmitted electrical power generally increases. Similarly, the strength of the wirelessly transmitted electrical power decreases when the opposing coils become askew from each other. Therefore, the strength of the wirelessly transmitted electrical power can fluctuate depending upon distance and position of the respective transmitting and receiving coils.

The battery charging system of the present invention is not limited for use with near field resonant inductive coupling wireless power and may be utilized with other forms of wirelessly transmitted electrical energy such as, but not limited to, electromagnetic induction, electrodynamic induction, electrostatic induction, electromagnetic radiation, microwave power transmission, and power beam transmission. In addition, the battery charging system of the present invention may also be utilized with a constant power supply that is directly connected. For example, the battery charging system may be electrically connected to an electrical power outlet or electrical generator. The dynamic electrical charge power adjustment capability provided by the circuit of the battery charging system of the present invention maximizes electrical power, and thus decreases charge time. For example, the battery charging system may be configured to actively monitor the terminal voltage of a cell or battery pack to thus enable maximized use of charging current and thus decrease charging times.

In either case, the electrochemical cell charging system of the present invention enables dynamic charging of an electrochemical cell based on actively monitoring the parameters of the available electrical power. Thus, the dynamic charging capability that is enabled by the charging system ensures increased utilization of the available electrical power.

These and other objects of the present invention will become increasingly more apparent to those skilled in the art by reference to the following description and to the appended drawings.

DETAILED DESCRIPTION OF THE PREFERRED EMBODIMENTS

Figure 1:
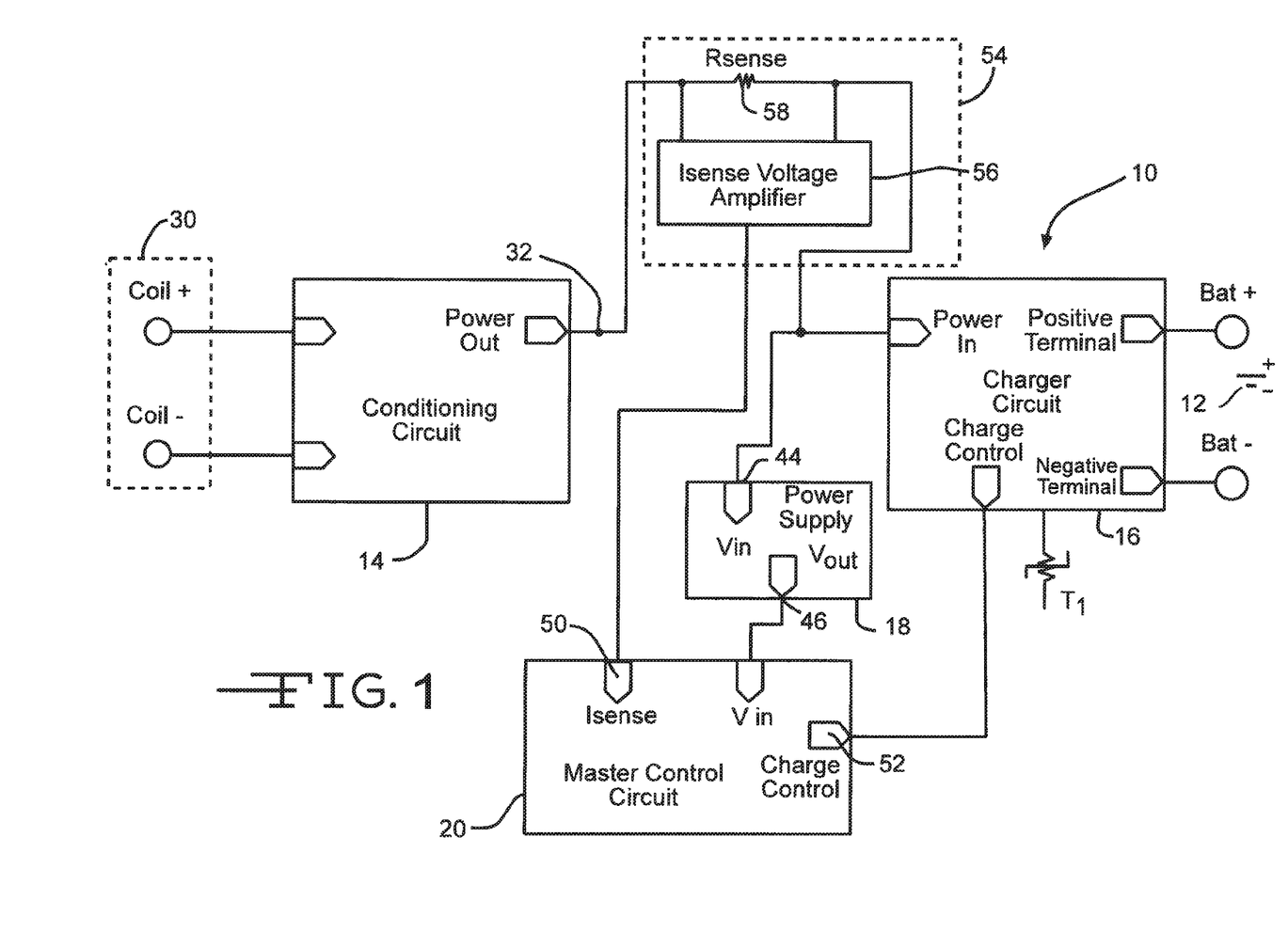
FIG. 1 illustrates an electrical schematic diagram of an embodiment of an electrochemical cell charging system of the present invention.

Now turning to the figures, FIG. 1 illustrates an electrical schematic diagram of an embodiment of an electrical charging system 10 of the present invention. The electrical charging system 10 is configurable to charge an electrical energy storage device 12 such as an electrochemical cell, battery pack, or capacitor. Specifically, the charging system 10 of the present invention is designed to dynamically change the rate at which a cell or battery pack is charged as a function of the amplitude of the electrical power available to the system 10.

As defined herein, an electrical energy storage device is an apparatus that is capable of repeatably storing electrical energy. An electrochemical cell is a device capable of generating electrical energy from a chemical reaction. A "battery pack" comprises a plurality of at least two electrochemical cells that are electrically connected together to provide an electrical power source. In a preferred embodiment the electrochemical cell or battery pack comprises at least one rechargeable or secondary electrochemical cell. As defined herein, "charge power" is the electrical power emitted by the charging system 10 that charges an electrical energy storage device such as an electrochemical cell or battery pack. "Charge current" is the electrical current that is emitted by the charging system 10 to charge a cell, "Charge voltage" is the electrical voltage that is emitted by the charging system 10 to charge a cell. "Charge power" (P) is equal to charge voltage (V) multiplied by charge current (I).

Figure 4:
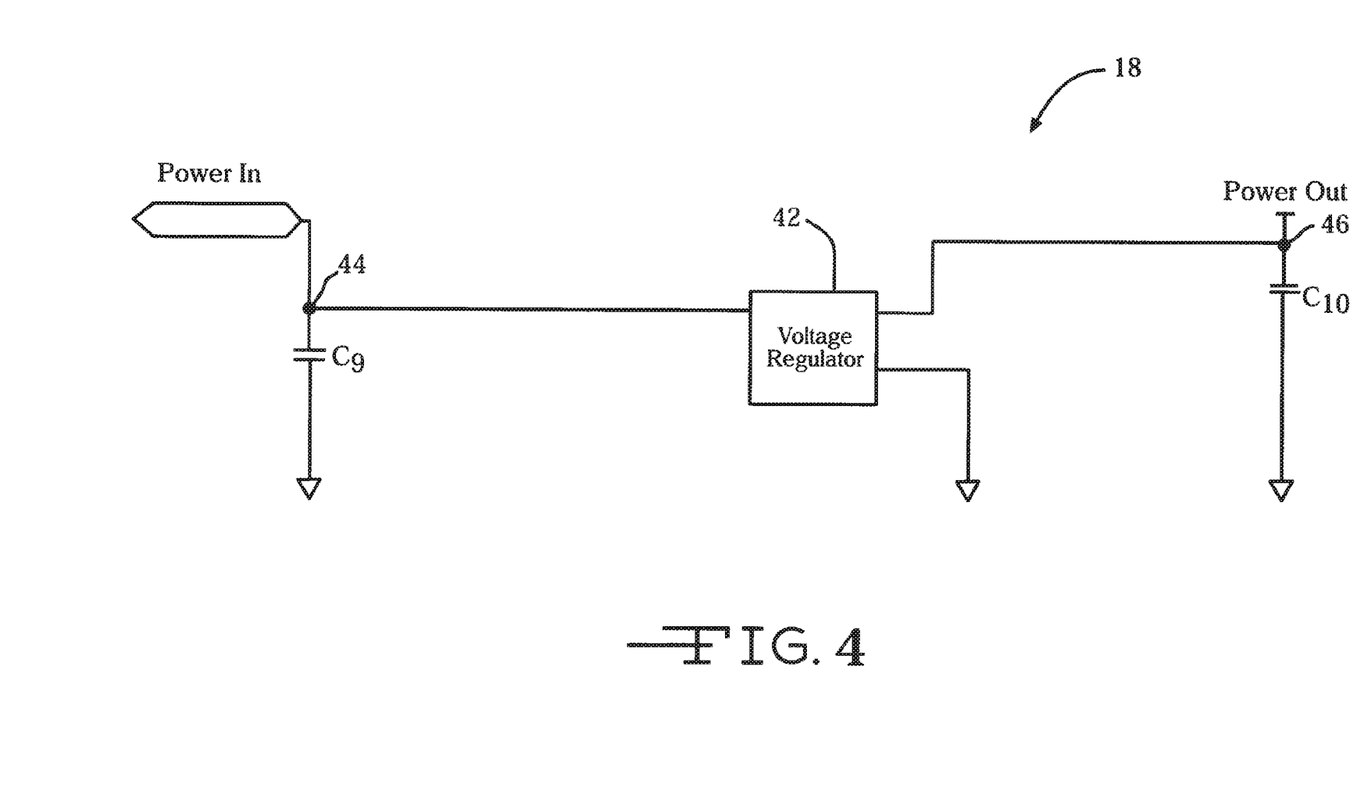
FIG. 4 is an electrical schematic diagram of an embodiment of an electrical power supply that is utilized by the electrochemical cell charging system of the present invention.
Figure 5:
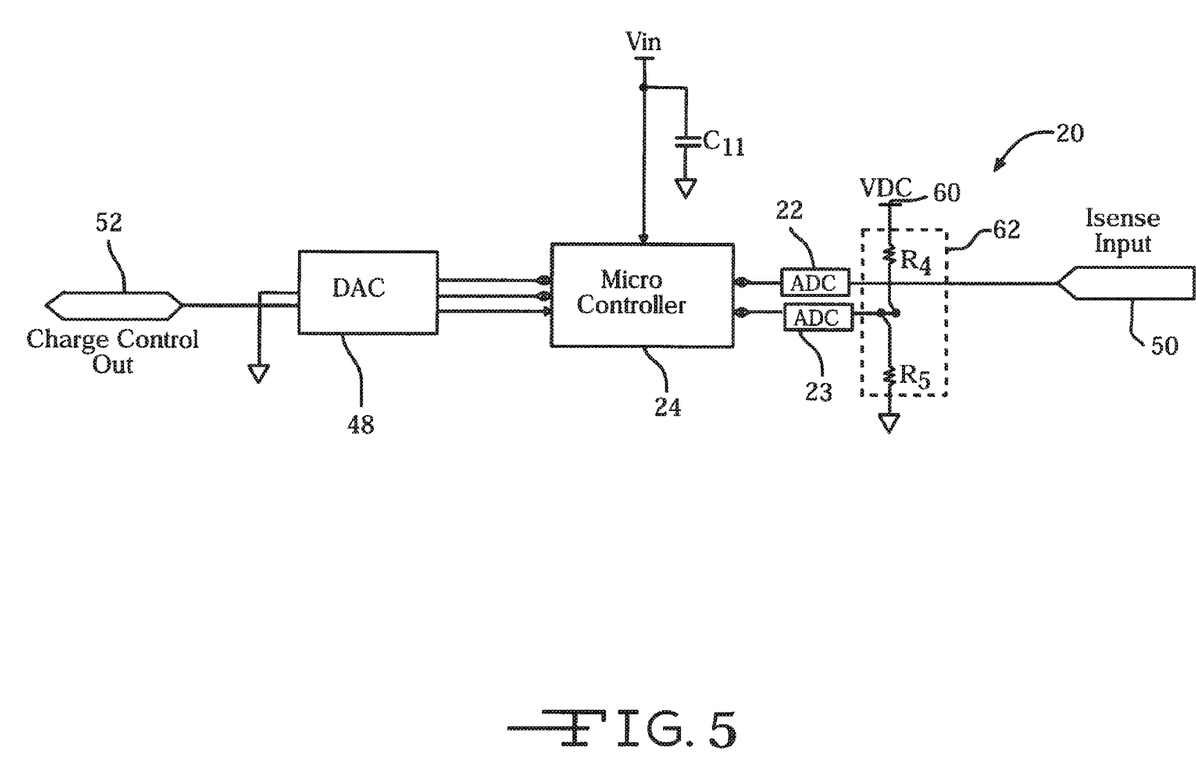
FIG. 5 illustrates an electrical schematic diagram of an embodiment of a master control circuit that is comprised within the charging system of the present invention.

As illustrated in FIG. 1, the charging system 10 of the present invention comprises an electrical power conditioning circuit 14 (FIG. 2), a charger circuit 16 (FIGS. 3A and 3B) that is electrically connectable to an electrochemical cell or battery pack, an electrical power supply circuit 18 (FIG. 4) and a master control circuit 20 (FIG. 5). The charger circuit 16 is configured to modify the available electrical power received by the system 10 so that it is in a condition to charge an electrical storage device 12. The master control circuit 20 controls the operation of the charging system 10. It is designed to measure the magnitude of the available electrical power and dynamically modify the parameters that comprise the charge power through modifying the amount of current and/or voltage used to charge a cell or battery pack according to the parameters of the incoming electrical power. The master control circuit 20 therefore controls the charge rate of a cell or battery pack through analysis of direct in situ measurement of the electrical current and/or electrical voltage of the electrical power available to the system 10. Thus, based on the strength of the incoming electrical power and the condition of the cell, the master control circuit 20 appropriately adjusts the magnitude of the electrical current and/or electrical voltage that is utilized to charge a cell or battery pack.

The amount of electrical power received by the system 10 is calculated by the master control circuit 20 by directly measuring the voltage or current of the electrical power provided that the corresponding voltage or current value is known. The corresponding electrical voltage or current value may be directly measured by the system or alternately, the value may be pre-programmed into the system 10.

As will be discussed in more detail, the current or voltage of the incoming power is preferably received by at least one analog to digital converter (ADC) 22 (FIG. 5) where it is converted to a digital signal that is received by a micro controller or master control unit (MCU) 24. Based on the incoming ADC digital signal, the MCU 24 calculates the appropriate charge current and/or charge voltage which is then communicated to the charger circuit 16 of the system 10. The received electrical voltage or current signal thus instructs the parameters, i.e., the charge current and charge voltage that should be utilized by the charge circuit 16 to safely and effectively charge an electrochemical cell or battery pack.

Figure 2:
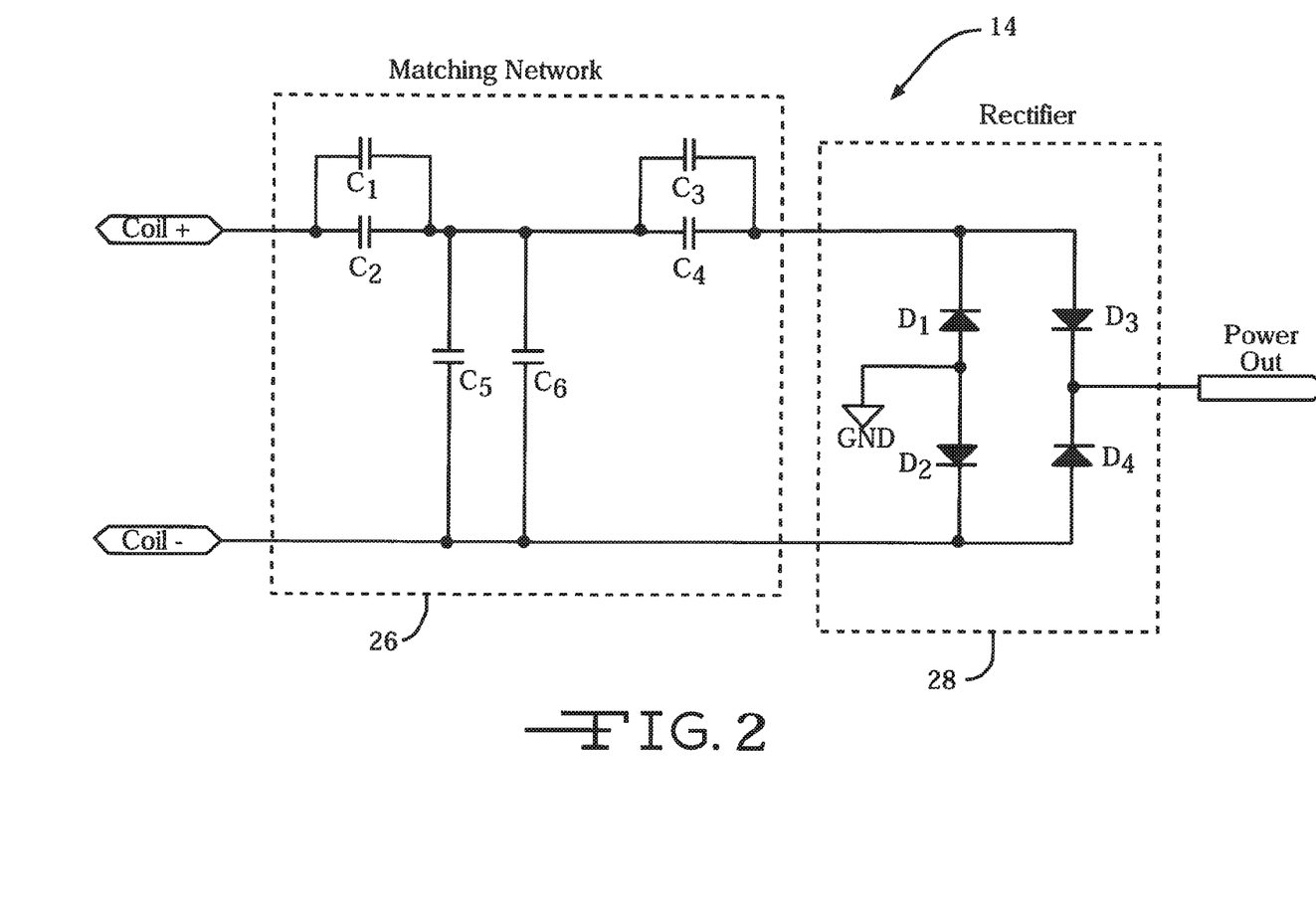
FIG. 2 is an electrical schematic diagram of an embodiment of an electrical power conditioning circuit comprising a matching electrical impedance circuit and a rectifying circuit.

In a preferred embodiment, the charging system 10 of the present invention is configured to utilize wirelessly transmitted electrical power. FIG. 2 illustrates an electrical schematic diagram of an embodiment of the conditioning circuit 14. As shown, the conditioning circuit 14 comprises a matching electrical impedance circuit 26 and a rectification circuit 28. The conditioning circuit 14 is designed to harness and convert wirelessly received electrical power into a rectified power supply. The electrical power source is preferably transmitted via near field resonant inductive coupling between a transmitting first resonator (not shown) and a receiving second resonator 30 (FIG. 1). More specifically, the conditioning circuit 14 is designed to capture and Modify alternating current electrical power that is transmitted wirelessly via near field resonant inductive coupling and convert it into direct current (DC) such that it can be used to charge an attached electrochemical cell or battery pack.

While it is preferred that the charging system 10 of the present invention is configured to harness and modify wirelessly transmitted electrical power, the charging system 10 may be directly hard wired to an external electrical power source such as an electrical wall, outlet or electric generator. In this case, the conditioning circuit 14 is removed from the system 10 and a direct power supply is connected to the system 10 at node 32 illustrated in FIG. 1. It is contemplated that the rectifier portion 28 of the conditioning circuit 14 may be used to rectify the hard wired power source comprising an alternating current to direct current electrical power.

The electrical power received by the system 10 is designed to charge a secondary electrochemical cell or battery pack. Such secondary electrochemical cells may include, but are not limited to, electrochemical chemistries such as lithium ion (Li-ion), lithium ion polymer (Li-ion polymer), nickel metal hydride (NiMH), and nickel cadmium (NiCd). In a preferred embodiment, the charging system 10 of the present invention may be used to enable charging of cells and power packs requiring from about 1 milliwatts to about 500 kilowatts of electrical power.

Specifically in near-field resonant inductive coupling wireless electrical power transfer, a source resonator is electrically connected to an electrical power generator with direct electrical connections. A receiving resonator, positioned a distance away from the source resonator, is electrically connected to a load (i.e., a device) with direct electrical connections. The source and receiving resonators are coupled via a magnetic field therebetween to exchange electrical energy wirelessly between the source and the receiving resonators in order to transmit electrical power from the power generator to the device.

A resonator may be constructed such that the energy stored by the electric field is primarily confined within the resonator structure and energy stored by the magnetic field is primarily in the region surrounding the resonator. Thus, the electrical energy exchange is mediated primarily by the resonant magnetic near-field surrounding the space about the resonators. The resonator, sometimes referred to as a "coil", is generally constructed by wrapping a metallic wire around a core of magnetic material. Additional information about resonators utilized in near field resonant induction power transfer can be found in U.S. patent application publication no. 2012/0235634 to Hall et al.

The conditioning circuit 14 serves to convert the electrical power received from the receiving second coil 30 from an alternating current electrical power to a direct current electrical power for use in powering an electronic device. The electrical impedance matching or network circuit 26 is electrically connected to the rectifying circuit 28. The impedance matching circuit 26 is designed to adjust and match the electrical impedance of the receiving resonator 30 to a characteristic impedance of the power generator or the load at a driving frequency of the source or transmitting first resonator (not shown). In general, the efficiency and amount of electrical power delivered between the source resonator and a receiving resonator is largely dependent on the impedance of the inductive element of the source and receiving resonators relative to the electrical properties of the device to which the receiving coil is connected thereto. Therefore, the impedance-matching network circuit 26 is designed to maximize the efficiency of the electrical power delivered between the source resonator (not shown) and the receiving second coil 30.

As illustrated in FIG. 2, the matching network circuit 26 comprises a series of capacitors $C_1$-$C_6$ that are arranged to actively adjust and match the electrical impedance of the receiving resonator 30 to the electrical impedance of the source resonator and connected electrical power source. It is noted that some capacitors may be removed or additional capacitors may be added to achieve optimal impedance match.

Once the wireless electrical power passes through the matching network circuit 26, the electrical power continues through the rectification circuit 28. In a preferred embodiment, the rectification circuit 28 modifies the electrical current of the received electrical power from alternating current to direct current. In a preferred embodiment illustrated in the electrical schematic of FIG. 2, the rectifying circuit 28 comprises a series of diodes, $D_1$-$D_4$.

As illustrated in FIG. 1, incoming electrical power either, received wirelessly or through direct electrical connection, is received at node 32. The received electrical power is directed to the voltage regulator circuit 18 and the charging circuit 16 where the power is modified to charge a cell. The voltage regulator circuit 18 modifies the amplitude of the voltage of the incoming electrical power so that can be used to power the circuitry that comprises the charging system 10.

Figure 3A:
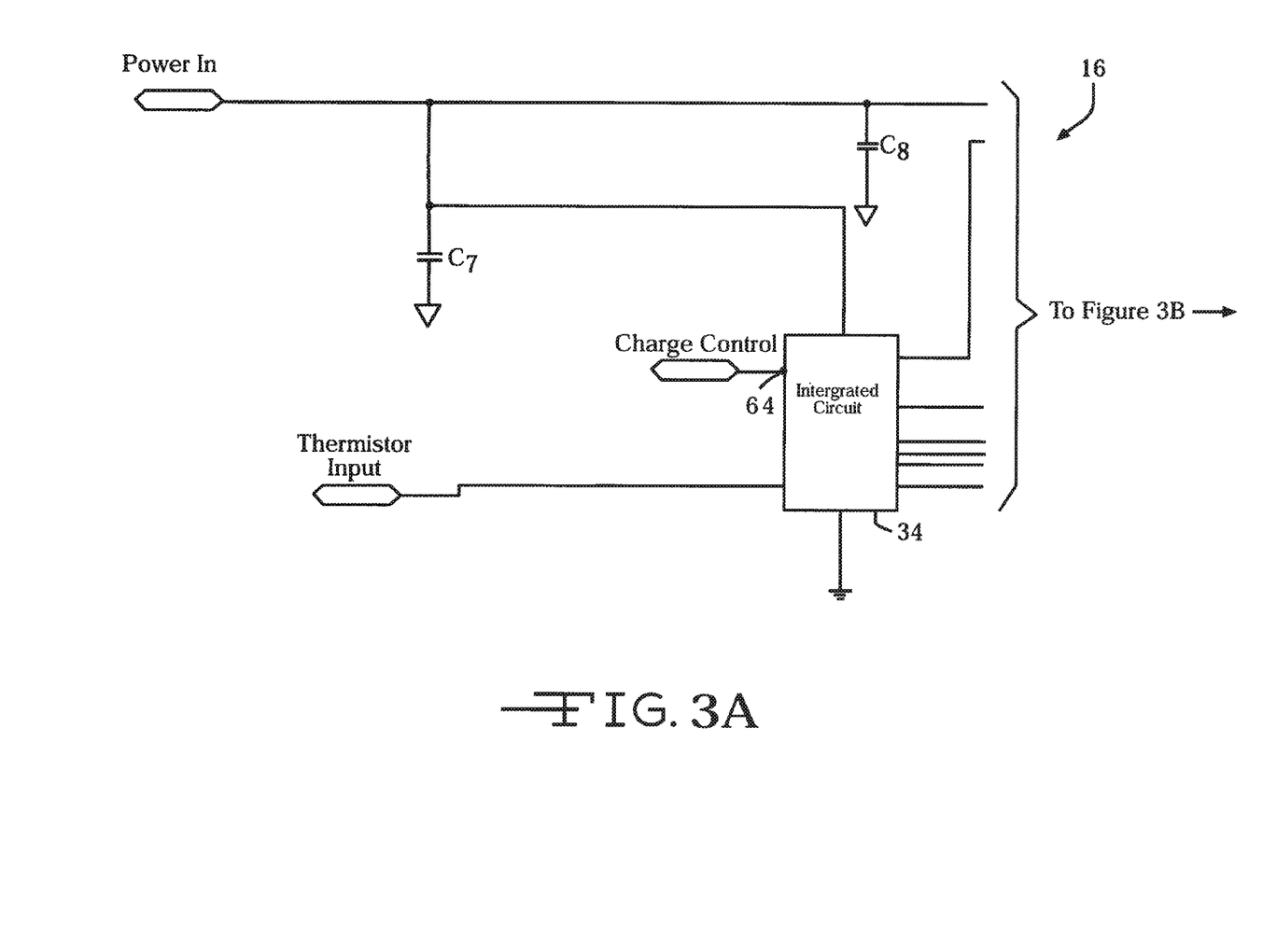
FIGS. 3A and 3B illustrate an electrical schematic diagram of an embodiment of an electrochemical cell charging circuit.
Figure 3B:
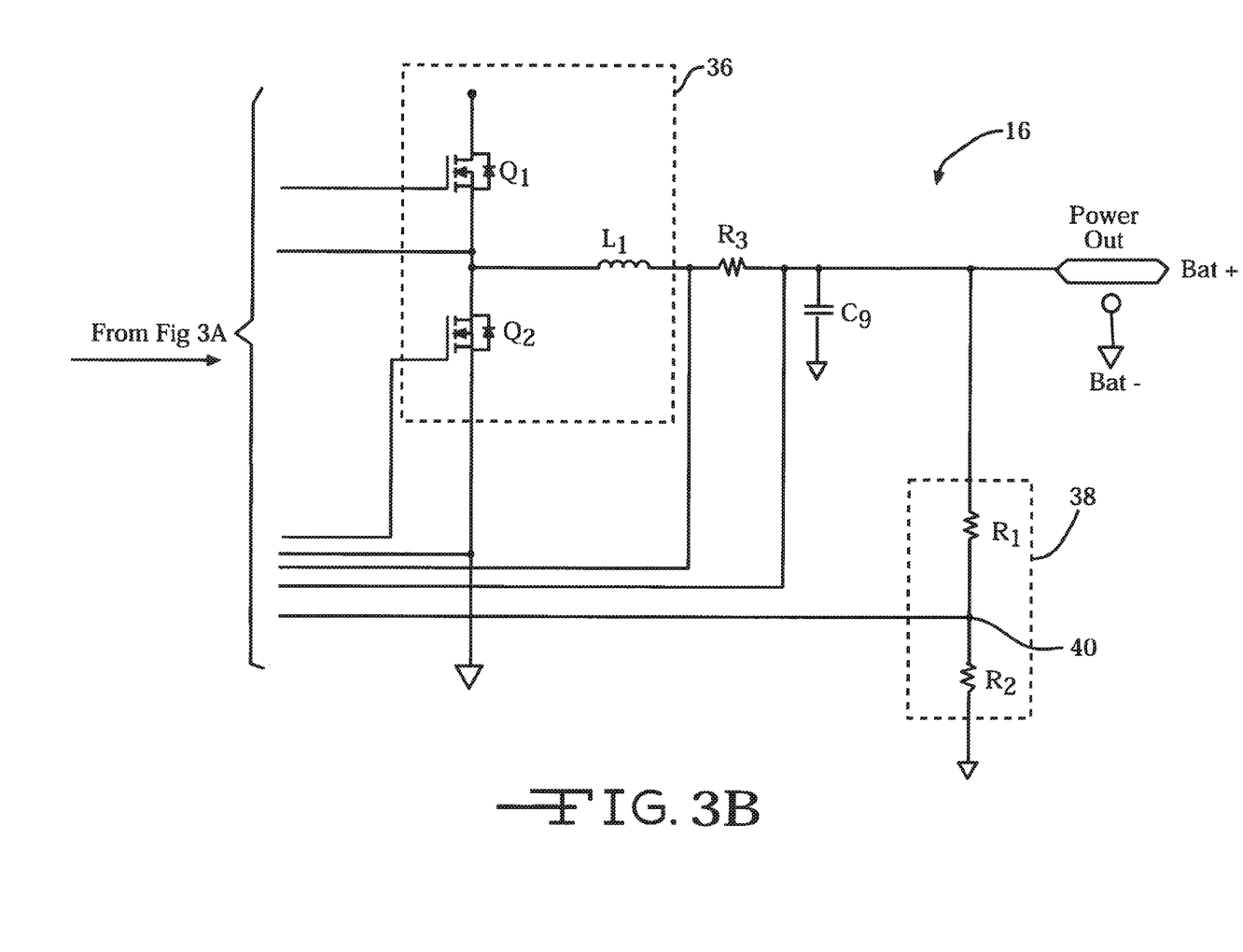

FIGS. 3A and 3B illustrate an embodiment of the charging circuit 16 that is comprised within the system 10 of the present invention. As shown, the circuit 16 comprises an integrated circuit. 34 that controls operation of the circuit 16. Alternatively, operation of the charger circuit 16 may be directly controlled by the master control circuit 20. In addition, the charger circuit 16 comprises a buck converter 36, comprised of field effect transistors $Q_1$, $Q_2$, inductor $L_1$ and capacitor $C_9$, that is capable of modifying the amplitude of the output charge voltage of the charge power used to charge a battery or battery pack. Furthermore, the charger circuit 16 is capable of dynamically regulating the amount of electrical power (charge power) used to charge a battery or battery pack. Since electrical power is equal to current multiplied by voltage, the amount of electrical power that is emitted by the charging circuit 16 can be modified by either changing the charge current and/or the charge voltage. In a preferred embodiment, the incoming analog voltage signal from the master control circuit 20 sets the output charge current. The integrated circuit 34 receives the master control voltage signal and thus, modifies the charge current in accordance with the received signal.

In general, as an electrochemical cell or battery pack is charged, its internal resistance decreases. Therefore, in order to keep the charge current constant, for example, to match the value of the incoming current, the charge voltage is modified in step with the constant current and the changing internal resistance. For example, since $I=V/R$, as the internal resistance of the cell decreases with increasing charge, the charge voltage is also decreased. Therefore, the buck converter 36 is used to modify the charge voltage to compensate for the change in internal resistance.

In a preferred embodiment, the charge voltage is modified to achieve a desired output voltage by alternately switching the first and second FETs $Q_1$, $Q_2$, of the electrical buck converter 36 in "on" and "off" positions according to a duty cycle set by the charger circuit integrated circuit 34 and/or the master control circuit micro control unit 24 (FIG. 5). In general, increasing the duty cycle increases the output voltage whereas, decreasing the duty cycle, decreases the output voltage of the electrical power. Thus, by modifying the voltage of the available rectified electrical power, the charging circuit can therefore adjust the magnitude of the output power to the cell or battery pack. It is noted that when the field effect transistor (FET) is in an "on" position, electrical current is allowed to flow through the FET. Likewise, when the field effect transistor (FET) is in an "off" position, electrical current does not flow through the FET.

The charging circuit 16 also comprises a resistor divider 38 comprised of series resistors $R_1$ and $R_2$. In a preferred embodiment, the ratio of the two resistance values sets the maximum threshold charge voltage at node 40 for the charger circuit 16. In a preferred embodiment, the maximum threshold charge voltage is set to the voltage of the cell or the battery pack. Thus, by setting the maximum threshold voltage to the cell or battery pack, the charger 16 effectively limits the maximum voltage that can be utilized to charge the battery. Thus, a maximum threshold voltage limits the charge current for a battery or battery pack thereby, preventing a possible over charge which could result in cell rupture. In addition, the micro control unit 24 of the master control circuit 20 may also be pre-programmed with a maximum charge current such that a cell is not charged beyond a maximum safe charge rate.

Furthermore, the charging circuit 16 may also comprise at least one current sensing resistor $R_3$. The current sensing resistor $R_3$ enables the integrated circuit 34 and/or the master control circuit 20 to measure the amount of electrical charge current being supplied to a cell or battery pack. Thus, the current sensing resistor $R_3$ ensures that the appropriate amount of electrical current is being delivered to the cell. In addition, the current sensing resistor $R_3$ acts as a safety measure to ensure that the maximum electrical charge current is not exceeded.

The charging circuit 16 may also comprise at least one thermistor $T_1$ (FIG. 1). A thermistor is an electrical sensor that is configured to measure a change in temperature. As the temperature rises or falls, a voltage potential is created by the thermistor. This change in voltage, which equates to a corresponding change in temperature, is electrically sent via a thermistor signal to the integrated circuit 16 or micro control unit 24 within the charger circuit 16 or master control circuit 20. In an embodiment, the integrated circuit 16 and/or the MCU 20 actively monitor the signals originating from the thermistor $T_1$, thus monitoring the temperature of the surrounding environment. If the temperature exceeds a specific temperature, for example, above about 60° C., the integrated circuit 16 may be configured to send a signal to the master control circuit 20 to shut down the system 10. Likewise, if the change in temperature of the surrounding environment decreases by about 20° C., the integrated circuit 16 may also be configured to send a signal to the master control circuit 20 to shut down the system 10. Alternatively, the master control circuit 20 may override the integrated circuit 16 and shutdown the system 10 directly.

FIG. 4 illustrates an electrical circuit diagram of an embodiment of the voltage regulator circuit 18 which comprises a voltage regulator 42. In a preferred embodiment, incoming electrical power is received by the voltage regulator circuit 18 at node 44. The voltage of the electrical power is thus adjusted by the voltage regulator 42 such that it can be appropriately used to power the individual circuits of the system 10. In a preferred embodiment, the voltage is adjusted to between about 3 to 6 volts. Once the voltage of the incoming power is appropriately adjusted, the power exits the voltage regulator circuit 20 through at least a first power out node 46. As illustrated in FIG. 1, the power out node 46 is electrically connected to the master control circuit 20 to thus provide operating power thereto. Additional power out nodes may be added to provide power to operate the charge circuit 16 or other electrical components that comprise the system 10. The amplitude of the voltage of the electrical power at each output node 46 may be the same or different from each other. In addition to the voltage regulator 42, the voltage regulator circuit 18 comprises capacitors $C_9$-$C_{10}$, which condition the voltage of the rectified power.

FIG. 5 illustrates an electrical circuit, diagram of an embodiment of the master control circuit 20 that is comprised within the system 10. As shown, the circuit 20 comprises the micro control unit (MCU) 24, the analog to digital converter (ADC) 22 and a digital to analog converter (DAC) 48 that are electrically connected to the micro control unit 24. In summary, the analog voltage or current from the incoming electrical power enters the ADC 22 at the "Isense" input node 50, is received by the MCU 24 and exits the DAC 48 through the "charge control" output node 52. In an alternate embodiment, the analog to digital converter (ADC) 22 and/or the digital to analog converter (DAC) 48 may be comprised within the micro control unit (MCU) 24.

As shown in FIG. 1, the charging system 10 comprises an "Isense" circuit. 54 which comprises a voltage amplifier 56 that is electrically connected to a resistor (Rsense) 58. The "Isense" circuit 54 enables the master control circuit 20 to measure the voltage of the incoming electrical power. The voltage from the incoming electrical power is first received by the ADC 22 at the "Isense" input node 50. The amplifier 56 is used to increase the magnitude of the voltage of the incoming electrical power so that a more accurate reading can be made by the MCU 24. In general, increasing the magnitude of the voltage increases the resolution and thus enables a more accurate current measurement by the MCU 24 of the master control circuit 20.

In a preferred embodiment, the voltage amplifier 56 comprises a differential amplifier which increases the magnitude of the voltage drop across the Rsense resistor 58 by an amplifier gain. The amplified voltage drop is received by the ADC 22 at the "Isense" input 50 shown in FIG. 5. The ADC 22 converts the received analog voltage into a binary number that is then received by the MCU 24 of the master control circuit 20.

For example, assuming an Rsense resistor 58 of 10 m Ohms, the voltage drop of the incoming electrical power across the Isense circuit 54 is measured to be 10 mV. Given an amplifier gain of 100, the voltage received at the Isense input node 50 would be 1V (100 gain×10 mV). The ADC 22 then converts the received voltage to a binary number. Assuming a 10 bit analog to digital converter that operates at 5V, provides a resolution of 4.88 mV per step (5V operating range/1024 steps ($2^{10}$)). Thus, the absolute value of the decimal number of the 1V for this particular example is 204 (1V/0.00488 Vsteps).

The MCU 24 of the master control circuit 20 interprets the received ADO digital number to determine the current and amount of the electrical power that is available to the system 10. Given the known values of the Rsense resistance, the gain of the amplifier 56, and the ADC voltage step value, the MCU 24 is thus capable of determining the current of the incoming electrical power. For example, the 204 digital number previously provided by the ADC 22 is multiplied by the ADC voltage step value and then divided by the amplifier gain value, which in this example equals 0.009955V ((204× 0.00488 vstep)/100 gain). Thus, using Ohm's law and the known value of the Rsense resistor 58, the current of the incoming electrical power is calculated. Assuming the same values from the previous example, the current of the incoming electrical power is calculated as 0.009955V/0.01 ohms=0.9955 A, or about 1 A.

In an alternate embodiment, voltage from the incoming electrical power may be measured by the master control circuit 20 at node 60 labeled "VDC" in FIG. 5. As illustrated, in FIG. 5 the voltage received at node 60 spans across a resistor divider 62 that comprises opposing resistors $R_4$ and $R_5$ that are connected in series to each other. In a preferred embodiment, the resistance values of the respective values of the two resistors $R_4$, $R_5$ are selected such that the voltage coming into the master control circuit 20 (FIG. 5) is a fraction of its initial value. In a preferred embodiment, the resistor divider 62 decreases the incoming voltage to between about 10 percent to about 90 percent of the magnitude of the initial voltage value. In a preferred embodiment, the voltage divider decreases the magnitude of the voltage of the rectified electrical power such that it is within the ADC's readable voltage range. As shown, the voltage output of the voltage divider 62 is received by a second analog to digital converter 23. The incoming current may then be calculated using Ohm's law from the resistance value of the resistor divider 62.

Thus, based on the calculated amplitude of the current of the incoming electrical power, the master control circuit 20 selects an appropriate charge current for the cell or battery pack. In a preferred embodiment, the micro control unit (MCU) 24 selects an appropriate charge current, such as the value of the current of the incoming electrical power, which is then communicated to the DAC 48 in the form of a digital signal such as a digital number as previously discussed (FIG. 5). The DAC 48 receives the digital signal from the MCU 24 which is then converted to an analog voltage. The DAC voltage is then received by the integrated circuit 34 of the charging circuit 16 at the "charge control input" node as shown in FIG. 3A. The received DAC voltage, which is preferably received at an "Iset" pin 64 of the integrated circuit 34 of the charger circuit 16, instructs the circuit 16 as to how much current is required to charge the cell or battery pack. In a preferred embodiment, the micro control unit 24 of the master control circuit 20 may also perform the functions of the ADC 22 and the DAC 48 such that the master control circuit 20 may be further miniaturized.

A constantly repeating cycle is thus created in which the master control circuit 20 samples the incoming current of the available power, determines the appropriate charge current and executes instructions to the charging circuit 16. In a preferred embodiment, this cycle is repeated at least 100 times a minute. More preferably, this cycle may be repeated between about 100 to about 1,000 times per minute. It is noted that the higher the cycle frequency rate, the more accurate the optimization of the charging condition becomes. This is particularly of benefit when wirelessly transmitted electrical power is used as a power source to charge a cell. Since the strength of the wireless power is highly dependent upon the separation distance and angular relationship between the transmitting and receiving coils, the amount of electrical power received by the system 10 may vary significantly. Thus, it is important that frequent measurements of the incoming electrical current that is available to charge a cell or battery pack are made to ensure optimized charging.

It is appreciated that various modifications to the inventive concepts described herein may be apparent to those of ordinary skill in the art without departing from the spirit and scope of the present invention as defined by the appended claims.

What is claimed is:

1. An electrical power control circuit, comprising:
    a) an Isense circuit comprising a voltage amplifier electrically connected to a first resistor, wherein the Isense circuit is configured to wirelessly receive electrical power from an electrical power source, and wherein the Isense circuit is configured to emit, through an electrical connection, a first analog voltage that is proportional to a first amplitude of an electrical current of the wirelessly received electrical power;
    b) a master control circuit comprising a micro control unit electrically connected to the Isense circuit, wherein the micro control unit is configured to receive the Isense circuit first analog voltage and emit, through an electrical connection, a master control signal; and
    c) a charger circuit electrically connected to the master control circuit, the charger circuit being configured to receive the master control signal and emit, through an electrical connection, an electrical charge power having a second amplitude, d) wherein, in response to analysis by the master control circuit of the first analog voltage emitted by the Isense circuit, the charger circuit is further configured to modify the second amplitude of the electrical charge power, and e) wherein the charger circuit is configured to electrically connect to and charge an energy storage device with the electrical charge power.

2. The electrical power control circuit of claim 1 wherein the master control circuit is configured to measure a voltage drop across the Isense circuit, and wherein the voltage drop is proportional to the first amplitude of the electrical current of the wirelessly received electrical power.

3. The electrical power control circuit of claim 1 wherein an analog to digital converter and a digital to analog converter are electrically connected to the micro control unit, and wherein the analog to digital converter is configured to convert the first analog voltage received from the Isense circuit to a first digital voltage signal that is then sent through an electrical connection to the master control circuit, and wherein the digital to analog converter is configured to convert the master control signal as a digital master control signal received from the micro control unit to a second analog voltage that is sent through an electrical connection to the charger circuit.

4. The electrical power control circuit of claim 1 wherein the master control signal is a digital master control signal or a second analog voltage.

5. The electrical power control circuit of claim 1 wherein the charger circuit comprises a buck converter configured to modify a charge voltage of the emitted electrical charge power depending on the charge of the connected energy storage device.

6. The electrical power control circuit of claim 1 wherein the micro control unit of the master control circuit is configured to receive or transmit a digital signal.

7. The electrical power control circuit of claim 1 wherein the micro control unit of the master control circuit comprises a digital processor, a master control unit, or an integrated circuit connected to the Isense circuit.

8. The electrical power control circuit of claim 1 wherein the charger circuit comprises an integrated circuit or a micro processor electrically connected to the master control circuit.

9. The electrical power control circuit of claim 1 further comprising an electrical power conditioning circuit comprising a matching network circuit and a rectifying circuit, wherein the electrical power conditioning circuit is configured to rectify the wirelessly received electrical power having an alternating current to an electrical power having a direct current.

10. The electrical power control circuit of claim 1 wherein the wirelessly received electrical power is received from the electrical power source by magnetic inductive coupling.

11. The electrical power control circuit of claim 1 wherein the Isense circuit first analog voltage is analyzed by the master control unit at a rate ranging from 100 to 1,000 times per minute.

12. The electrical power control circuit of claim 1 wherein the charger circuit comprises a current sensing resistor that is configured to electrically connect to an energy storage device, and wherein the current sensing resistor is further configured to measure the second amplitude of the electrical charge power emitted by the charge circuit and received by the energy storage device.

13. The electrical power control circuit of claim 1 wherein the energy storage device is selected from the group consisting of an electrochemical cell, a battery pack, and a combination thereof.

14. An electrical charging system, comprising:

a) a voltage divider comprising a first resistor electrically connected in series with a second resistor, wherein the voltage divider is configured to wirelessly receive electrical power from an electrical power source, and wherein the voltage divider is configured to emit, through an electrical connection, a first analog voltage that is proportional to a first amplitude of a voltage of the wirelessly received electrical power; and b) a master control circuit comprising a micro control unit electrically connected to the voltage divider, wherein the micro control unit is configured to receive the first analog voltage and emit, through an electrical connection, a master control signal;

c) a charger circuit electrically connected to the master control circuit, the charger circuit configured to receive the master control signal and emit, through an electrical connection, an electrical charge power having a second amplitude, d) wherein, in response to analysis by the master control circuit of the first analog voltage emitted by the voltage divider, the charger circuit is further configured to modify the second amplitude of the electrical charge power, and e) wherein the charger circuit is configured to electrically connect to and charge an energy storage device with the electrical charge power.

15. The electrical charging system of claim 14 wherein an analog to digital converter and a digital to analog converter are electrically connected to the micro control unit, and wherein the analog to digital converter is configured to convert the first analog voltage received from the voltage divider to a first digital voltage signal that is then sent through an electrical connection to the master control circuit, and wherein the digital to analog converter is configured to convert the master control signal as a digital master control signal received from the micro control unit to a second analog voltage that is sent through an electrical connection to the charger circuit.

16. The electrical charging system of claim 14 wherein the master control signal is a digital master control signal or a second analog voltage.

17. The electrical charging system of claim 14 wherein the energy storage device is selected from the group consisting of an electrochemical cell, a battery pack, and a combination thereof.

18. The electrical charging system of claim 14 wherein the charger circuit comprises a buck converter configured to modify a charge voltage of the electrical charge power.

19. The electrical charging system of claim 14 wherein the micro control unit of the master control circuit comprises a digital processor, a master-control unit, or an integrated circuit connected to the voltage divider.

20. The electrical charging system of claim 14 further comprising an electrical power conditioning circuit comprising a matching network circuit electrically connected to a rectifying circuit, wherein the electrical power conditioning circuit is configured to rectify the wirelessly received electrical power having an alternating electrical current to an electrical power having a direct current.

21. The electrical charging system of claim 14 wherein the wirelessly received electrical power is received from the electrical power source by magnetic inductive coupling.

22. The electrical charging system of claim 14 wherein the first analog voltage is analyzed by the master control unit at a rate ranging from 100 to 1,000 times per minute.

23. The electrical charging system of claim 14 wherein the charger circuit comprises a current sensing resistor that is configured to electrically connect to an energy storage device, and wherein the current sensing resistor is further configured to measure the second amplitude of the electrical charge power emitted by the charger circuit.

24. An electrical charging system, comprising:
  a) a receiving coil configured to receive an electrical power that is wirelessly transmitted from an electrical power source by near-field magnetic inductance;
  b) a conditioning circuit electrically connected to the receiving coil, the conditioning circuit comprising a matching network circuit and a rectifying circuit, wherein the conditioning circuit is configured to rectify the electrical power received by the receiving coil from an alternating current to a direct current;
  c) an Isense circuit electrically connected to the conditioning circuit, the Isense circuit comprising a first resistor electrically connected to a voltage amplifier, wherein the Isense circuit is configured to receive the rectified direct current from the conditioning circuit and emit, through an electrical connection, a first analog voltage that is proportional to a first amplitude of an electrical current of the electrical power received by the conditioning circuit from the receiving coil; and
  d) a master control circuit electrically connected to the Isense circuit, the master control circuit comprising:
    i) a micro control unit configured to receive the Isense circuit first analog voltage and emit through an electrical connection a digital master control signal;
    ii) an analog to digital converter electrically connected to the micro control unit, wherein the analog to digital converter is configured to convert the first analog voltage a first digital voltage signal that is then sent through an electrical connection to the micro controller;
    iii) a digital to analog converter electrically connected to the micro control unit, the digital to analog converter configured to convert the digital master control signal received from the micro control unit to a second analog voltage; and
  e) a charger circuit electrically connected to the master control circuit, wherein the charger circuit is configured to receive the second analog voltage and emit through an electrical connection an electrical charge power having a second amplitude,
  f) wherein, in response to analysis by the master control circuit of the first analog voltage emitted by the Isense circuit, the charger circuit is further configured to modify the second amplitude of the emitted electrical charge power, and
  g) wherein the charger circuit is configured to electrically connect to and charge an energy storage device with the electrical charge power.

25. The electrical charging system of claim 24 wherein the master control circuit is configured to measure a voltage drop across the Isense circuit, and wherein the voltage drop is proportional to the first amplitude of the electrical current of the electrical power received by the conditioning circuit from the receiving coil.

26. The electrical charging system of claim 24 wherein the energy storage device is selected from the group consisting of an electrochemical cell, a battery pack, and a combination thereof.

27. The electrical charging system of claim 24 wherein the charger circuit comprises a current sensing resistor that is configured to electrically connect to an energy storage device, and wherein the current sensing resistor is configured to measure the second amplitude of the electrical charge power emitted by the charger.

28. The electrical charging system of claim 24 wherein the Isense circuit first analog voltage is analyzed by the master control unit at a rate ranging from 100 to 1,000 times per minute.

29. An electrical charging system, comprising:
  a) a receiving coil configured to receive an electrical power that is wirelessly transmitted from an electrical power source by near-field magnetic inductance;
  b) a conditioning circuit electrically connected to the receiving coil, the conditioning circuit comprising a matching network circuit and a rectifying circuit, wherein the conditioning circuit is configured to rectify the electrical power received by the receiving coil from an alternating current to a direct current;
  c) an voltage divider electrically connected to the conditioning circuit, the voltage divider comprising a first resistor electrically connected in series with a second resistor, wherein the voltage divider is configured to receive the rectified direct current from the conditioning circuit and emit, through an electrical connection, a first analog voltage that is proportional to a first amplitude of a voltage of the electrical power received by the conditioning circuit from the receiving coil; and
  d) a master control circuit electrically connected to the voltage divider, the master control circuit comprising:
    i) a micro control unit configured to receive the voltage divider first analog voltage and emit, through an electrical connection, a digital master control signal;
    ii) an analog to digital converter electrically connected to the micro control unit, wherein the analog to digital converter is configured to convert the first analog voltage to a first digital voltage signal that is then sent through an electrical connection to the micro controller; and
    iii) a digital to analog converter electrically connected to the micro control unit, the digital to analog converter configured to convert the digital master control signal received from the micro control unit to a second analog voltage; and
  e) a charger circuit electrically connected to the master control circuit, wherein the charger circuit is configured to receive the second analog voltage and emit, through an electrical connection, an electrical charge power having a second amplitude,
  f) wherein, in response to analysis by the master control circuit of the first analog voltage emitted by the voltage divider, the charger circuit is further configured to modify the second amplitude of the emitted electrical charge power, and
  g) wherein the charger circuit is configured to electrically connect to and charge an energy storage device with the electrical charge power.

30. The electrical charging system of claim 29 wherein the energy storage device is selected from the group consisting of an electrochemical cell, a battery pack, and a combination thereof.

31. The electrical charging system of claim 29 wherein the charger circuit comprises a current sensing resistor that is configured to electrically connect to an energy storage device, and wherein the current sensing resistor is configured to measure the second amplitude of the electrical charge power emitted through an electrical connection by the charger circuit.

32. The electrical charging system of claim 29 wherein the voltage divider first analog voltage is analyzed by the master control unit at a rate from 100 to 1,000 times per minute.

33. An electrical power control circuit, comprising:
  a) an Isense circuit comprising a voltage amplifier electrically connected to a first resistor, wherein the Isense circuit is configured to wirelessly receive electrical power from an electrical power source, and wherein the Isense circuit is configured to emit, through an electrical connection, a first analog voltage that is proportional to a first amplitude of an electrical current of the wirelessly received electrical power;
  b) a micro control unit electrically connected to the Isense circuit, wherein the micro control unit is configured to receive the Isense circuit first analog voltage and emit, through an electrical connection, a master control signal; and
  c) a charger circuit electrically connected to the a micro control unit, the charger circuit being configured to receive the master control signal and emit, through an electrical connection, an electrical charge power having a second amplitude,
  d) wherein, in response to analysis by the master control circuit of the first analog voltage emitted by the Isense circuit, the charger circuit is further configured to modify the second amplitude of the electrical charge power, and
  e) wherein the charger circuit is configured to electrically connect to and charge an energy storage device with the electrical charge power.

34. The electrical power control circuit of claim 33 wherein the charger circuit comprises a buck converter configured to modify a charge voltage of the emitted electrical charge power depending on the charge of the connected energy storage device.

35. The electrical power control circuit of claim 33 wherein the micro control unit of the master control circuit is configured to receive or transmit a digital signal.

36. The electrical power control circuit of claim 33 further comprising an electrical power conditioning circuit comprising a matching network circuit and a rectifying circuit, wherein the electrical power conditioning circuit is configured to rectify the wirelessly received electrical power having an alternating current to an electrical power having a direct current.

* * * * *

UNITED STATES PATENT AND TRADEMARK OFFICE
CERTIFICATE OF CORRECTION

PATENT NO. : 9,866,051 B2
APPLICATION NO. : 14/492112
DATED : January 9, 2018
INVENTOR(S) : Brian R. Peterson It is certified that error appears in the above-identified patent and that said Letters Patent is hereby corrected as shown below:

In the Claims

Column 13, Line 41 (Claim 24, Line 28) after the word "voltage" insert --to--

Signed and Sealed this
Eighth Day of May, 2018

Andrei Iancu
*Director of the United States Patent and Trademark Office*